United States Patent
Skinner et al.

(10) Patent No.: US 6,583,987 B2
(45) Date of Patent: Jun. 24, 2003

(54) ELECTROMAGNETIC INTERFERENCE AND HEATSINKING

(75) Inventors: Harry G. Skinner, Beaverton, OR (US); Walter M. Kirkbride, Cornelius, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/123,971

(22) Filed: Apr. 16, 2002

(65) Prior Publication Data

US 2002/0114134 A1 Aug. 22, 2002

Related U.S. Application Data

(63) Continuation of application No. 09/259,422, filed on Feb. 26, 1999.

(51) Int. Cl.$^7$ .................................................. H01S 7/20
(52) U.S. Cl. ................... 361/704; 361/702; 361/818; 257/660; 257/659; 174/35 R
(58) Field of Search ....................... 361/689, 700, 361/702–712, 714–719, 721–727; 257/659, 706–727, 796, 668, 699, 698; 165/80.2, 80.3, 80.4, 185; 174/15.1, 16.3, 252, 35 GC, 35 R

(56) References Cited

U.S. PATENT DOCUMENTS

| | | | | |
|---|---|---|---|---|
| 4,039,921 A | * | 8/1977 | Yoshida et al. | 363/22 |
| 4,151,479 A | * | 4/1979 | Baba | 330/264 |
| 4,754,101 A | * | 6/1988 | Stickney et al. | 174/35 R |
| 4,928,138 A | * | 5/1990 | Walton et al. | 363/40 |
| 5,050,038 A | * | 9/1991 | Malaurie et al. | 361/386 |
| 5,053,924 A | * | 10/1991 | Kurgan | 361/424 |
| 5,175,613 A | * | 12/1992 | Barker et al. | 257/713 |
| 5,311,402 A | * | 5/1994 | Kobayashi et al. | 361/760 |
| 5,371,404 A | * | 12/1994 | Juskey et al. | 257/659 |
| 5,399,906 A | * | 3/1995 | Komuro | 257/705 |
| 5,459,348 A | * | 10/1995 | Smith | 257/659 |
| 5,468,910 A | * | 11/1995 | Knapp et al. | 174/52.2 |
| 5,485,037 A | * | 1/1996 | Marrs | 257/712 |
| 5,486,720 A | * | 1/1996 | Kierse | 257/659 |
| 5,541,811 A | * | 7/1996 | Henningsson et al. | 361/704 |
| 5,566,052 A | * | 10/1996 | Hughes | 361/704 |
| 5,717,248 A | * | 2/1998 | Neumann et al. | 257/718 |

(List continued on next page.)

FOREIGN PATENT DOCUMENTS

| | | | | | |
|---|---|---|---|---|---|
| JP | 356076551 A | * | 6/1981 | | H01L/23/12 |
| JP | 403152959 A | * | 6/1991 | | H01L/23/00 |
| JP | 404144268 A | * | 5/1992 | | H01L/25/00 |
| JP | 409027576 A | * | 1/1997 | | H01L/23/40 |
| JP | 410013066 A | * | 1/1998 | | H05K/7/20 |
| JP | 410070383 A | * | 3/1998 | | H05K/7/20 |
| JP | 411260976 A | * | 9/1999 | | H01L/23/36 |
| JP | 02000040637 A | * | 2/2000 | | H01G/4/228 |

OTHER PUBLICATIONS

"Thermal Enhancement and Mechanical Protection Cover"; IBM Technical Disclosure Bulletin, Mar. 1988, vol. 30, Issue No. 10, pp. 310–311.*

"Physically Integrated CRT Line Scan Circuit", IBM Technical Disclosure Bulletin, Dec. 1981, vol. 24, issue 7A, pp. 3212–3214.*

*Primary Examiner*—Michael Datskovsky
(74) *Attorney, Agent, or Firm*—Fish & Richardson P.C.

(57) ABSTRACT

A first apparatus includes a semiconductor device and a heat dissipating device (e.g., a heatsink) thermally coupled to the semiconductor device. The heat dissipating device is located and formed to screen the semiconductor device from external electromagnetic radiation or to contain radiation produced by the semiconductor device. A second apparatus includes a semiconductor device, a heat dissipating device thermally coupled to the semiconductor device, and a grounding structure having a capacitive coupling to the heatsink.

28 Claims, 6 Drawing Sheets

U.S. PATENT DOCUMENTS

| | | | | |
|---|---|---|---|---|
| 5,804,875 A | * | 9/1998 | Remsburg et al. | 257/718 |
| 5,866,943 A | * | 2/1999 | Metrol | 257/712 |
| 6,011,299 A | * | 1/2000 | Brench | 257/660 |
| 6,011,696 A | * | 1/2000 | Mahajan et al. | 361/782 |
| 6,018,460 A | * | 1/2000 | Borowiec et al. | 361/704 |
| 6,061,235 A | * | 5/2000 | Cromwell et al. | 361/690 |
| 6,075,700 A | * | 6/2000 | Houghton et al. | 361/704 |
| 6,167,949 B1 | * | 1/2001 | Langley et al. | 165/104.33 |

* cited by examiner

ELECTROMAGNETIC INTERFERENCE AND HEATSINKING

CROSS-REFERENCE TO RELATED APPLICATIONS

This application is a continuation and claims the benefit of priority under 35 USC 120 of U.S. patent application Ser. No. 09/259,422, filed Feb. 26, 1999.

BACKGROUND

This invention relates to electromagnetic interference and heat dissipating devices such as heatsinks.

Heat sinks act like radiation antennas, which can generate electromagnetic radiation levels that exceed U.S. and European regulations.

A large heatsink that is close to a high frequency microprocessor may behave as an antenna of electromagnetic radiation induced by the microprocessor. The emitted electromagnetic radiation can affect the performance of nearby devices.

SUMMARY

In a first aspect, an apparatus includes a semiconductor device and a heat dissipating device (e.g., a heatsink) thermally coupled to the semiconductor device. The heat dissipating device is located and formed to screen the semiconductor device from external electromagnetic radiation or to contain radiation produced by the semiconductor device.

In a second aspect, an apparatus includes a semiconductor device, a heat dissipating device thermally coupled to the semiconductor device, and a grounding structure. The grounding structure has a capacitive coupling to the heat dissipating device.

DRAWING DESCRIPTION

Other objects, features, and advantages will be apparent from the following description taken together with the drawings, in which.

DETAILED DESCRIPTION

Figure 1:
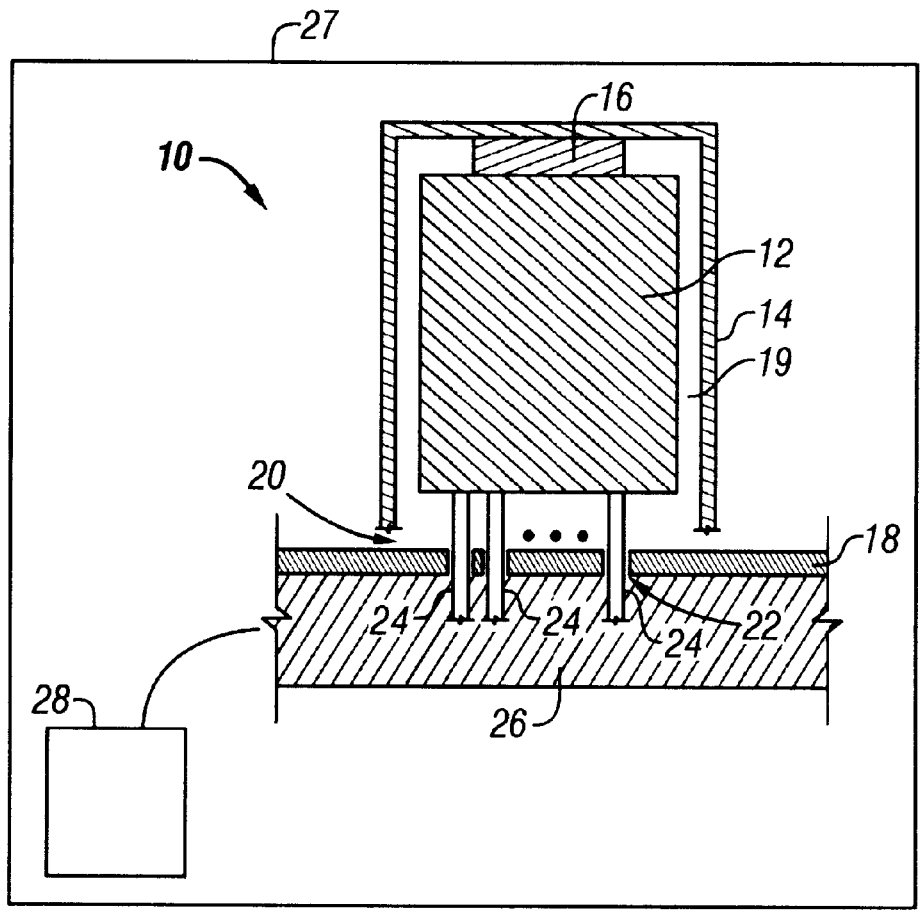
FIG. 1 is cross-sectional view of a system with a shielding heatsink.

As seen in FIG. 1, system 10 shields an active semiconductor device 12 from external electromagnetic radiation. The device 12 thermally couples to a heat dissipating device such as heatsink 14 constructed of a metal such as copper or aluminum. The heatsink 14 provides both cooling and containment of electromagnetic radiation from the device 12.

A conductive material 16 lies between the device 12 and a portion of the heatsink 14. The material 16 conducts heat from the device 12 to the heatsink 14. The material 16 is one of a variety of soft thermal conductors or conducting greases. Such conductive materials are made by Chomerics Inc., 77 Dragon Court, Woburn, Mass.

A conductive layer 18, e.g., a metallic layer, covers the mouth of a cavity 19 formed by the heatsink 14. Together the conducting layer 18 and the heatsink 14 form a Faraday cage around the semiconductor device 12. The Faraday cage has a gap 20 between the conducting layer 18 and heatsink 14, and holes 22 in the conducting layer 18. The holes 22 are exit ports for pins 24 from the device 12. The pins 24 connect the device 12 to a motherboard 26 without making electrical contact with the conducting layer 18. The conducting layer 18 may be fixed to or located within the motherboard 26 and may be a grounding layer of the motherboard 26.

For wavelengths substantially larger than any holes or gaps, the Faraday cage stops internal radiation from leaking out through the skin effect and screens external radiation from entering. Widths of the gaps and/or holes in the cage should be smaller than about ¼ of the smallest wavelength being shielded and less than about 1/10 of that wavelength for high-quality radiation shielding. The lateral length of the gap 20 also limits the quality of the electromagnetic shielding (see FIGS. 4–5). In addition, radiation containment improves if the heatsink 14 is AC grounded so that substantial currents do not flow on the heatsink's outside surface.

The heatsink 14 and conducting layer 18 shield the device 12 from electromagnetic radiation if the holes 22 and gap 20 satisfy the above size limits. The width of the gap 20 and the holes 22 fix the upper frequency for the shielding provided by the heatsink 14 and conducting layer 18. As processor speeds increase, frequencies of background electromagnetic radiation increase and the above limits on the width of the gap 20 become more important. For example, the limit on the width is about 3 millimeters for high-quality shielding of 10 gigahertz electromagnetic radiation.

The system 10 may be part of a computer having a housing 27. The motherboard 26 is rigidly fixed inside the housing 27. The housing 27 also encloses a memory device 28 electrically connected to the device 12 and other devices, e.g., a hard disk and ROM.

Figure 2:
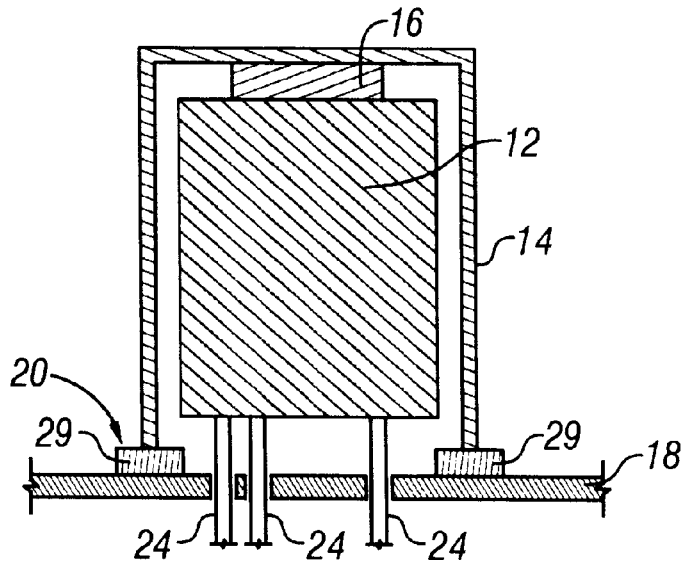
FIG. 2 is a cross-sectional view of one embodiment of the system of FIG. 1.
Figure 3:
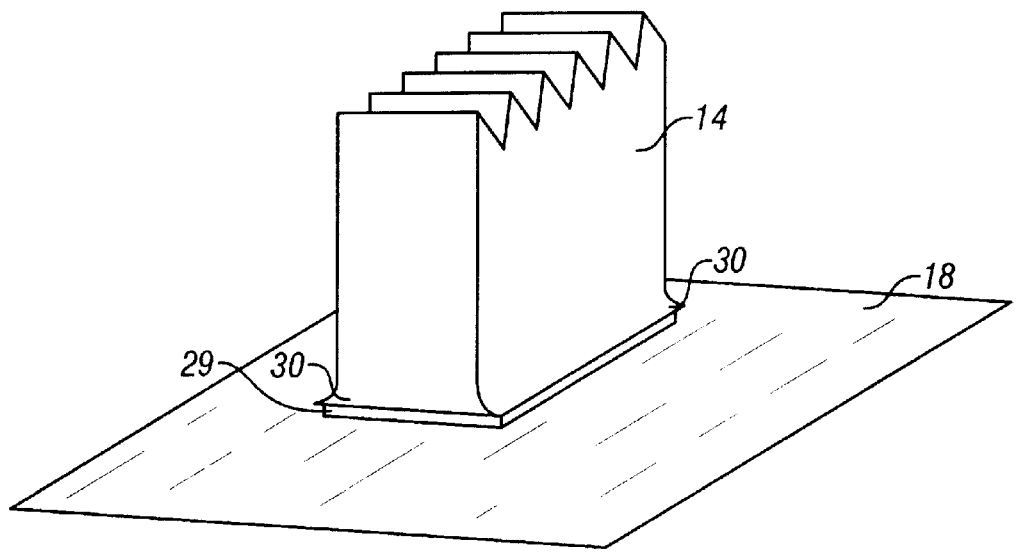
FIG. 3 is a 3-dimensional view of the embodiment of FIG. 2.

As shown in FIGS. 2 and 3, a gasket 29 may be located in the gap 20 between the heatsink 14 and the conducting layer 18. The gasket 29 may be a conductor, such as a metal ring, which closes the gap 20 to electromagnetic radiation leakage and forms a direct electrical coupling of the heatsink 14 to the layer 18.

In FIG. 3, the gasket 29 instead acts as a spacer, which electrically insulates the heatsink 14 from the conducting layer 18. In this case, the gasket 29 provides an AC coupling between the heatsink 14 and the conducting layer 18, but excludes a direct DC contact, which may not be desirable in certain applications. The heatsink 14 may have a flanged lip 30, which increases its capacitive coupling to the conducting layer 18, e.g., AC-coupling the heatsink 14 to the layer 18.

Figure 4:
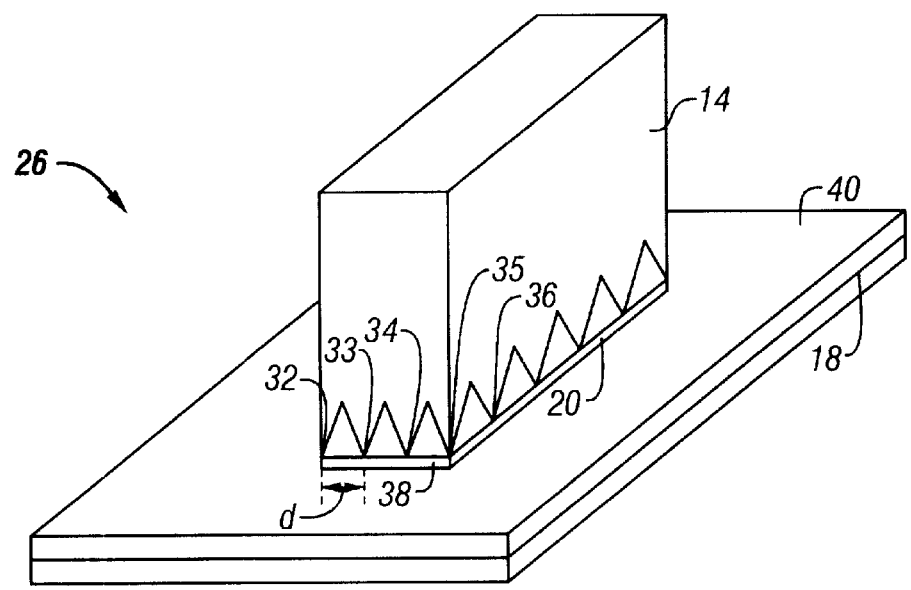
FIG. 4 is a 3-dimensional view of another embodiment of the system of FIG. 1.
Figure 5:
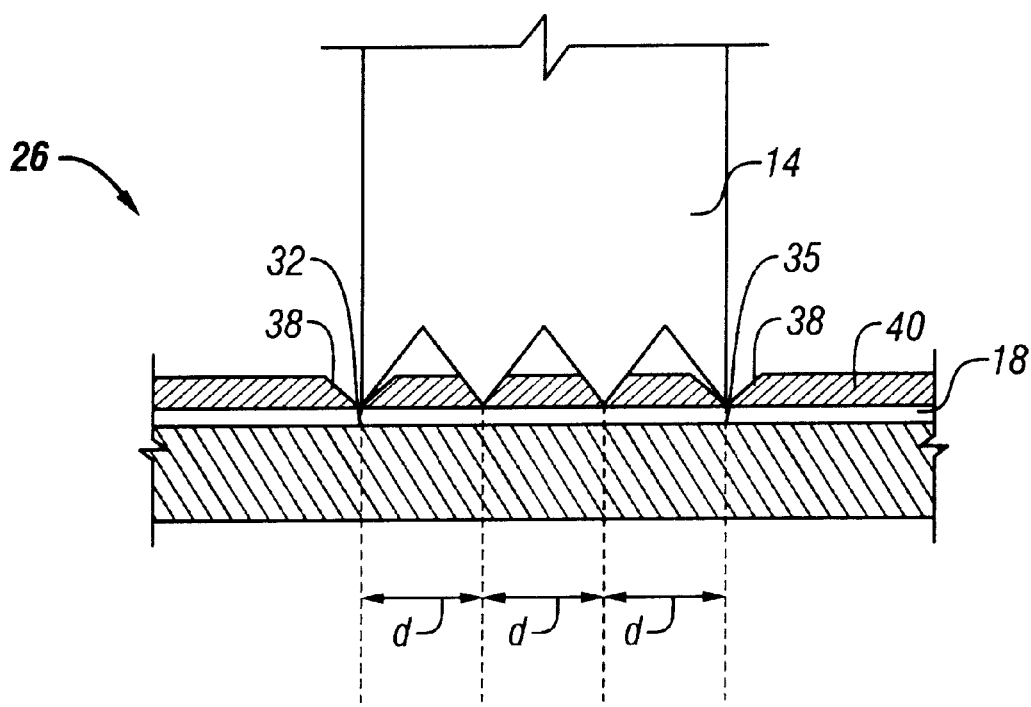
FIG. 5 is a cross-sectional view of the embodiment of FIG. 4.

In another example, shown in FIGS. 4 and 5, a insulating top surface 40 covers the conducting layer 18. The heatsink 14 has fine teeth 32–36 along the gap 20. The teeth 32–36 make electrical contact with a ring-like via 38 cut into an insulating top surface 40 of the motherboard 26. The via 38 makes electrical contact with the conducting layer 18, which is inside the motherboard 26. The via 38 allows a close physical connection between the teeth 32–36 and the conducting layer 18. The spacing "d" between the teeth 32–36 is less than about ¼, and preferably less than ¹⁄₁₀, of the wavelengths of electromagnetic radiation to be contained within or screened out. The teeth reduce the lateral length of the gap 20, which might otherwise be a source of radiation leakage.

Figure 6A:
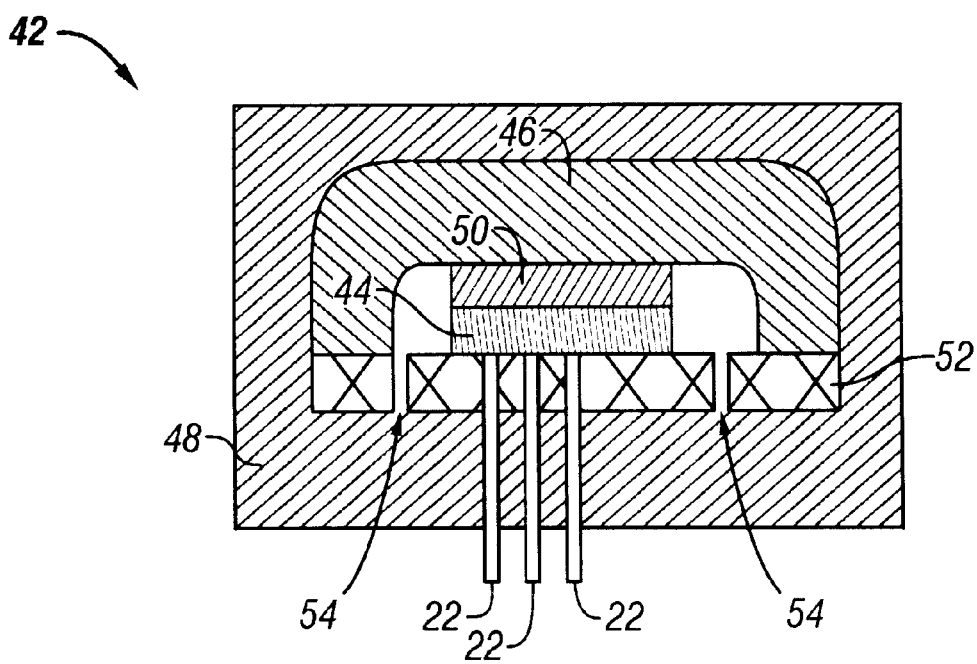
FIG. 6A shows a semiconductor device with an internal shielding heatsink.

FIG. 6A is a cross-sectional view of an active device 42 in which a semiconductor die 44 has a heatsink 46 internal to a plastic encapsulating housing 48. The die 44 dissipates heat to the heatsink 46 through a conductive material 50. The heatsink 46 attaches to a conducting organic line grid array 52. The organic line grid array provides structural support, i.e. rigidity, to the fragile die 44. The heatsink 46 and the organic line grid array 52 form a substantially closed Faraday cage around the die 44. The Faraday cage may have holes 54 and/or gaps, which provide electrical access ports to the die 44. The widths of the holes 54 and/or gaps satisfy the above-disclosed limits so that the Faraday cage contains radiation produced by the die 44 and screens the die 44 from external radiation.

Figure 6B:
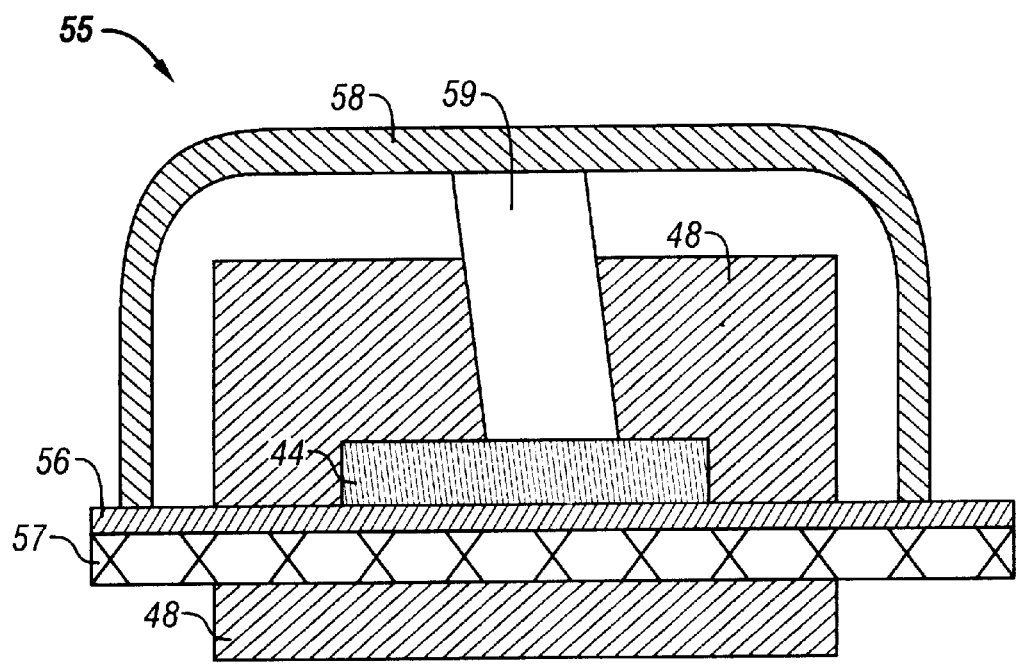
FIG. 6B shows a semiconductor device with a partial internal and partially external Faraday cage.

FIG. 6B is a cross-sectional view of a device 55 in which the die 44, a conducting layer 56 and a support substrate 57 have portions internal and portions external to a plastic encapsulating housing 48. The die 44 dissipates heat to the heatsink 58 through a conductive material 59. The heatsink 58 attaches to an external portion of the conducting layer 56 to form a Faraday cage. The heatsink 58 is external to the housing 48. The heatsink 58 and the conducting layer 56 provide electromagnetic shielding.

Figure 7:
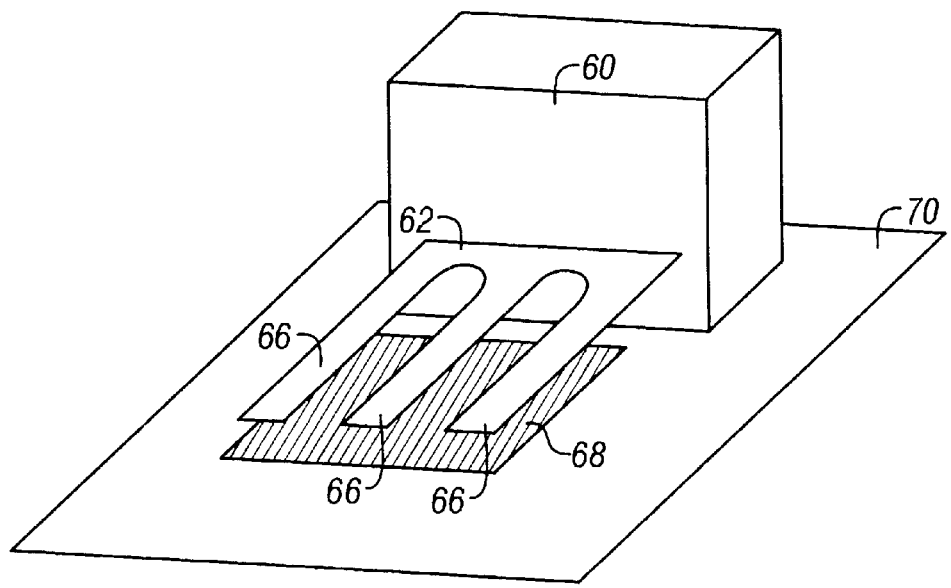
FIG. 7 shows a device with an AC-grounded heatsink.
Figure 8:
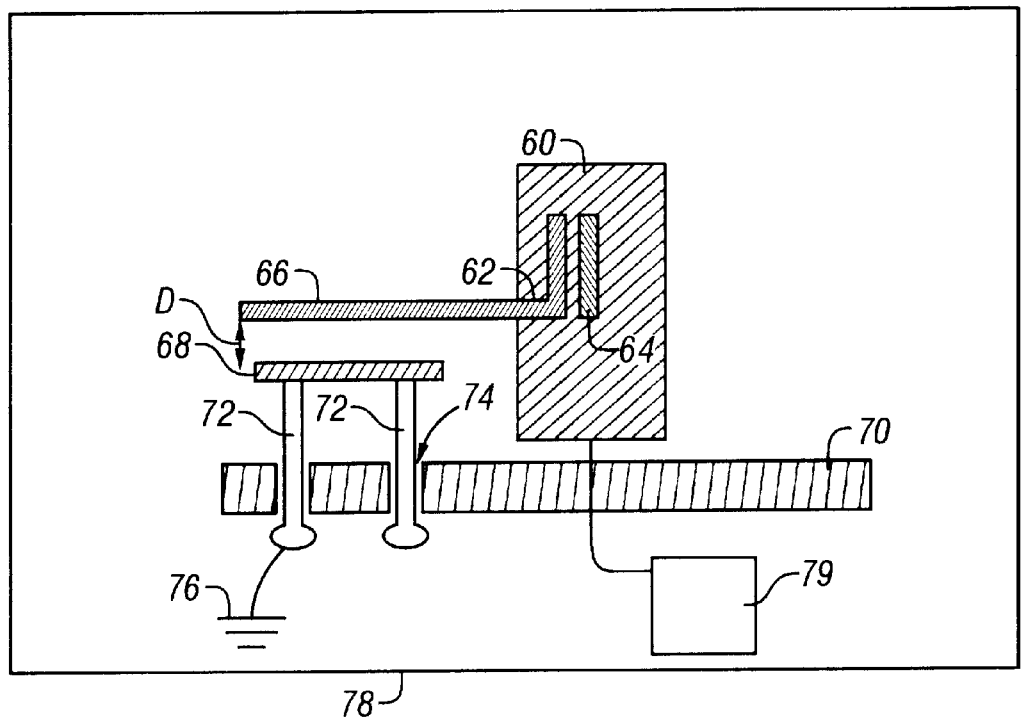
FIG. 8 is a cross-sectional view of the device of FIG. 7.

FIGS. 7 and 8 show an active device 60, e.g., a microprocessor, and an attached heatsink 62. The heatsink 62 has a close thermal contact with a semiconductor die 64 located inside the device 60. The heatsink 62 has external fins 66, which project outward from the device 60. The fins 66 may be parallel to a conducting plate 68 fixed to a motherboard 70. The active device 60 also physically connects to the motherboard 70.

FIG. 8 shows the relative position of the fins 66 and the conducting plate 68. The conducting plate is rigidly supported above the motherboard by pins 72. The pins 72 may be held in retention mechanism holes 74 if the motherboard 70 is built according to an ATX 2.03 motherboard specification, published on Dec. 11, 1998. Further details on the ATX motherboard specification may be found at www.teleport.com\~atx\. The fins 66 project parallel to the plate 68 to form a capacitor C. The fins 66 and the conducting plate 68 form the respective first and second plates of the capacitor C. The conducting plate 68 connects through the pins 72 to a ground structure 76, e.g., a motherboard ground or a chassis ground of the system using the device 60. The capacitive coupling between the fins 66 and the conducting plate 68 forms an AC-ground for the heatsink 62.

The active device 60 may be the processor for a computer having an external housing 78. The motherboard 70 is fixed in the interior of the housing 78. The housing 78 also encloses a memory device 79 electrically connected to the device 60, i.e., to the processor.

Figure 9:
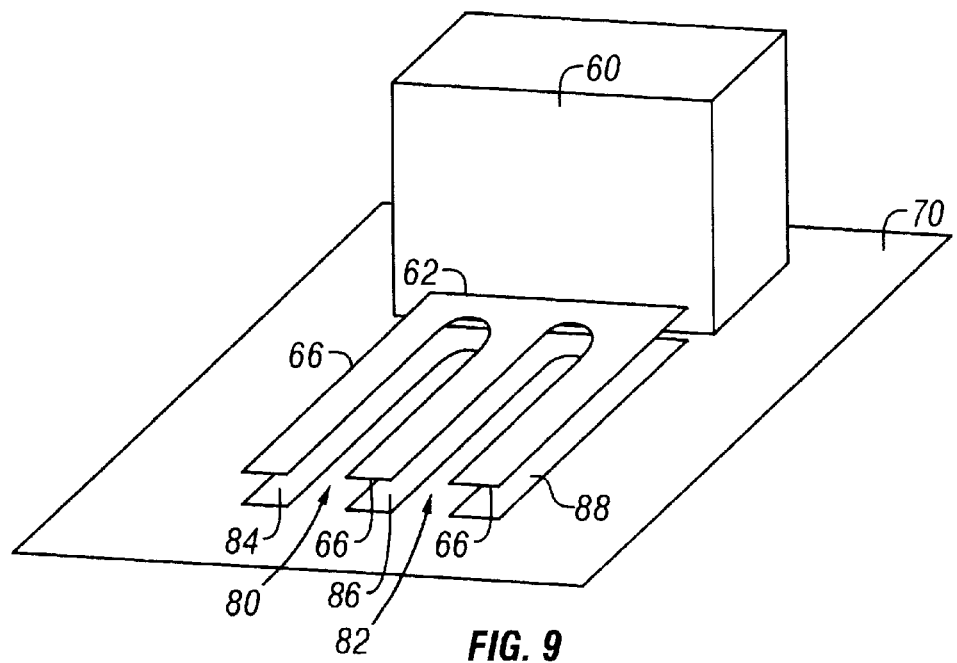
FIG. 9 is a top view of one embodiment of the device of FIG. 7.

FIG. 9 shows an embodiment of the active device 60 of FIGS. 7–8. The grounding plate 68 (FIGS. 7–8) has a plurality of slots 80, 82, which separate a plurality of lobes 84, 86, 88 of the plate 68. The slots 80, 82 allow a freer airflow between the fins 66 and increase the cooling that the heatsink 62 provides to the active device 60.

Figure 10:
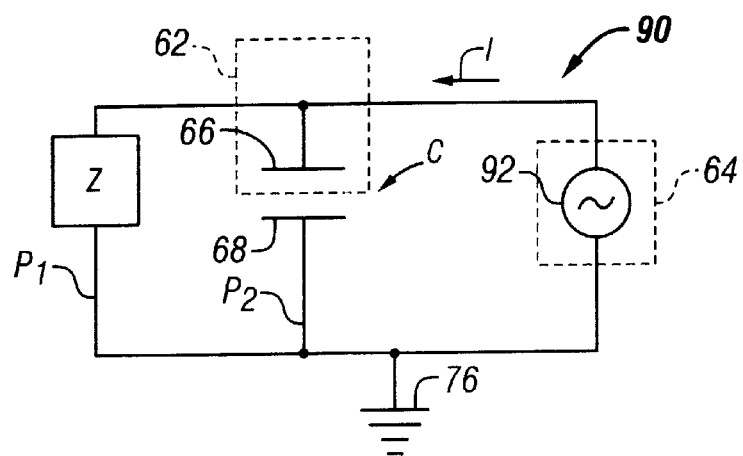
FIG. 10 is a circuit diagram for an AC-grounded heatsink.

FIG. 10 is an equivalent circuit 90 for the semiconductor die 64 and heatsink 62 of FIGS. 7–8. The semiconductor die 64 acts as an AC voltage generator 92, which drives a current I through the heatsink 62. From the heatsink 62, the current has two paths $P_1$, $P_2$ to ground 76. On first path $P_1$, the heatsink 62 acts as an antenna, which emits electromagnetic radiation to free space. Free space acts as an effective impedance Z to the ground 76. Z is equal to about 377 ohms between about 30 megahertz and 40,000 megahertz. This is the range for electromagnetic emissions regulated by the Federal Communications Commission in the U.S.A. On the second path $P_2$, the fins 66 act as a plate of the capacitor C whose second plate is the grounded conducting plate 68. If the impedance of the capacitor C is much smaller than the impedance Z, most of the current I flows though the second path $P_2$, and the heatsink 62 emits much less electromagnetic radiation.

If the active device 60, is a high frequency processor, AC-grounding the heatsink 62 can reduce electromagnetic emissions. By using AC-grounding, the heatsink 62 does not become a path for DC-currents in the semiconductor die 64 to short to the ground 76, which may be undesirable in certain applications.

A capacitance C of about 20 to 200 pico-farads significantly lowers electromagnetic radiation emissions from the fins 66 in the 100 to 400 megahertz range. Such a value for C may be obtained either by increasing the overlap area or by reducing the separation D between the fins 66 and the conducting plate 68. The separation D can be very small if either the fins 66 or the plate 68 is anodized with an insulating coating (not shown). If an insulating coating is used, the fins 66 and the conducting plate 68 can be in physical contact without DC-grounding the heatsink 62.

Figure 11:
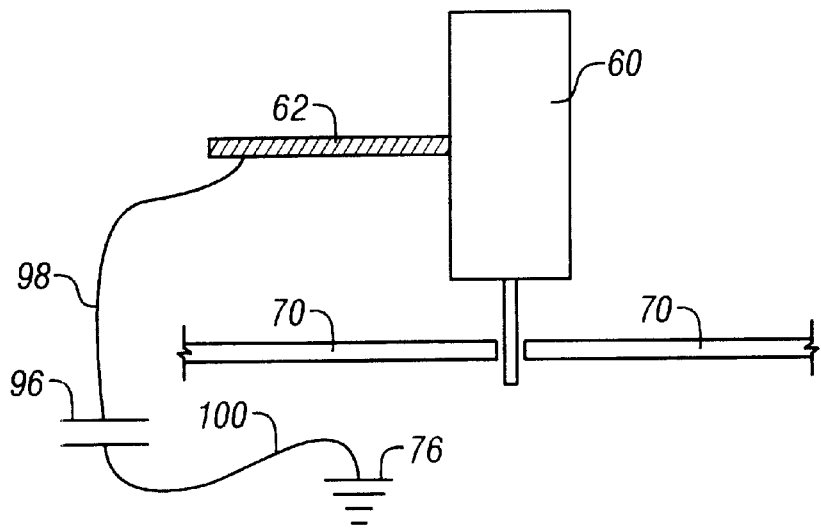
FIG. 11 shows a heatsink grounded by a lumped capacitor.

FIG. 11 illustrates an embodiment, in which a lumped capacitor 96 AC-grounds the heatsink 62. The lumped capacitor 96 electrically couples to the heatsink 62 through a wire 98 and to the grounding structure 76 through a wire 100.

Figure 12:
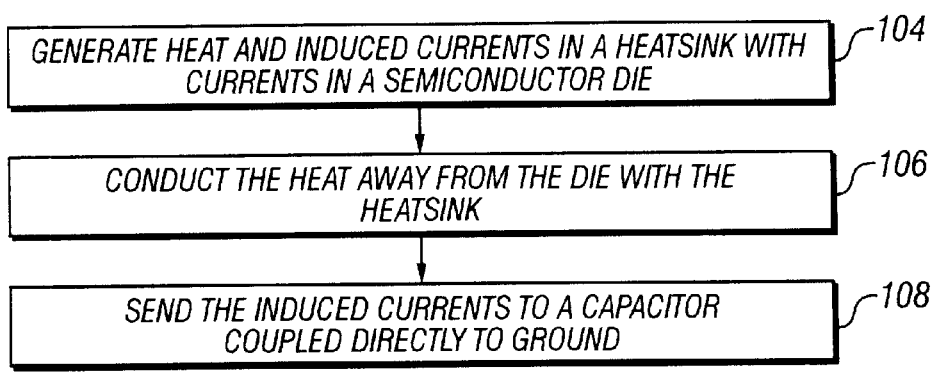
FIG. 12 is a flow chart for a method of using a heatsink.

FIG. 12 is a flowchart illustrating a method 102 of using the heatsink 62 of FIGS. 7–11. Currents in the semiconductor die 64 generate heat and induce a current in the nearby heatsink 62 (step 104). The currents may be in the 30 megahertz to 40,000 megahertz frequency range. The heatsink 62 conducts the heat away from the semiconductor die 64 (step 106). The heatsink 62 conducts most of the induced current to a capacitor connected directly to the grounding structure 76 (step 108).

Other embodiments are within the scope of the following claims.

What is claimed is:

1. An apparatus comprising:

a semiconductor device;

a heat dissipating device thermally coupled to and DC-isolated from the semiconductor device, the heat dissipating device being formed at least in part as a substantially planar element and configured relative to the semiconductor device to perform at least one of screening the semiconductor device from external electromagnetic radiation and containing radiation produced by the semiconductor device; and a conducting layer connected to signal ground and disposed substantially parallel to the planar element to form a capacitive structure that AC-couples the heat dissipating device to signal ground; and wherein the heat dissipating device forms a cavity with a mouth covered by the conductive layer to form a substantially closed cage, the semiconductor device being inside the cage.

2. The apparatus of claim 1, wherein the cage provides substantial shielding to the semiconductor device from external electromagnetic radiation having frequencies of up to about 10 gigahertz.

3. The apparatus of claim 1, wherein the cage substantially contains electromagnetic radiation produced by the semiconductor device from leaking out for frequencies of up to about 3 gigahertz.

4. The apparatus of claim 1, further comprising:
   a motherboard, the semiconductor device being electrically connected to the motherboard.

5. The apparatus of claim 4, wherein the conducting layer is fixed to the motherboard.

6. The apparatus of claim 1, further comprising:
   a gasket positioned to provide a space between the heat dissipating device and the conductive layer.

7. The apparatus of claim 1, wherein the device further comprises:
   a semiconductor die; and
   a plastic package encapsulating the semiconductor die and a portion of the conducting layer, the heat dissipating device being located outside of the plastic package.

8. The apparatus of claim 1, wherein the device further comprises:
   a semiconductor die; and
   a plastic package encapsulating the semiconductor die and the heat dissipating device.

9. The apparatus of claim 8, wherein the conductive layer is encapsulated by the package.

10. The apparatus of claim 9, wherein the die is fixed to the conductive layer and the conductive layer provides structural support to the die.

11. The apparatus of further claim 1, further comprising:
    one of a thermally conductive grease and a soft conductor forming a thermal contact between the heat dissipating device and the semiconductor device.

12. An apparatus comprising:
    a semiconductor device;
    a heat dissipating device thermally coupled to and DC-isolated from the semiconductor device;
    a capacitive grounding structure connected to signal ground and configured to AC-couple the heat dissipating device to signal ground, wherein the capacitive grounding structure comprises a conducting plate directly coupled to signal ground and being positioned relative to the heat dissipating device to form a capacitor; and
    wherein the heat dissipating device forms a cavity with a mouth covered by the conducting plate to form a substantially closed cage, the semiconductor device being inside the cage.

13. The apparatus of claim 12, wherein the heat dissipating device comprises a heatsink.

14. The apparatus of claim 12, further comprising:
    a motherboard, the conducting plate and the semiconductor device being attached to the mother board.

15. The apparatus of claim 12, further comprising:
    a lumped capacitor electrically connected between the heat dissipating device and the grounding structure.

16. The apparatus of claim 12, wherein the capacitor has a capacitance at least as large as 20 pico-farads.

17. A computing system comprising:
    a microprocessor;
    a heat dissipating device thermally coupled to and DC-isolated from the microprocessor, the heat dissipating device formed at least in part as a substantially planar element and configured relative to the microprocessor to shield the microprocessor from external electromagnetic radiation and to substantially contain electromagnetic radiation produced by the microprocessor;
    a motherboard, the microprocessor being electrically connected to the motherboard; and
    a conducting layer connected to signal ground and disposed substantially parallel to the planar element to form a capacitive structure that AC-couples the heat dissipating device to signal ground, wherein the conducting layer forms a substantially closed cage with the heat dissipating device, the microprocessor being inside the cage.

18. The computing system of claim 17, wherein the cage provides substantial shielding for electromagnetic radiation having frequencies of up to about 40 gigahertz.

19. The computing of claim 17, wherein the microprocessor further comprises:
    a semiconductor die; and
    a plastic package encapsulating the semiconductor die and at least partially encapsulating the conducting layer.

20. The apparatus of claim 17, further comprising:
    a computer housing, the motherboard and cage located inside the housing.

21. A computing system comprising:
    a housing;
    at least one of a motherboard and a daughterboard located in the housing;
    a microprocessor located on the one of a motherboard and a daughterboard;
    a heat dissipating device thermally coupled to and DC-isolated from the microprocessor;
    a capacitive grounding structure connected to signal ground and configured to AC-couple the heat dissipating device to signal ground; and
    wherein the heat dissipating device forms a cavity with a mouth covered by a conductor to form a substantially closed cage, the semiconductor device being inside the cage.

22. The computing system of claim 21, wherein the heat dissipating device comprises a heatsink.

23. The computing system of claim 21, wherein the capacitive AC-coupling substantially reduces emissions of electromagnetic radiation by the heat dissipating device at frequencies above about 30 megahertz.

24. A method of using a heat dissipating device, the method comprising:
    generating current in a semiconductor die;
    inducing AC current in a heat dissipating device forming a cavity, with a mouth of the heat dissipating device substantially covered by conducting material to form a substantially closed cage, the heat dissipating device thermally coupled to and DC-isolated from the die as a result of the current in the semiconductor die; and
    providing electromagnetic emissions shielding by conducting the induced AC current through a capacitive coupling between the heat dissipating device and the conducting material.

25. The method of claim 24, wherein the heat dissipating device comprises a heatsink.

26. The method of claim 24, further comprising:
   producing heat from the currents in the semiconductor die; and
   conducting the heat away from the die with the heat dissipating device.

27. The method of claim 26, wherein conducting heat away from the die keeps the semiconductor die at a normal operating temperature.

28. The method of claim 24, wherein current is generated in the die at frequencies above 500 megahertz.

* * * * *